United States Patent
Zaal et al.

(10) Patent No.: US 7,133,120 B2
(45) Date of Patent: Nov. 7, 2006

(54) LITHOGRAPHIC APPARATUS, ARTICLE SUPPORT MEMBER, AND METHOD

(75) Inventors: Koen Jacobus Johannes Maria Zaal, Eindhoven (NL); Aschwin Lodewijk Hendricus Johannes Van Meer, Roosendaal (NL); Joost Jeroen Ottens, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 89 days.

(21) Appl. No.: 10/837,914

(22) Filed: May 4, 2004

(65) Prior Publication Data

US 2005/0248746 A1 Nov. 10, 2005

(51) Int. Cl.
G03B 27/62 (2006.01)
G03B 27/58 (2006.01)

(52) U.S. Cl. .......................... 355/75; 355/72
(58) Field of Classification Search .......... 355/72, 355/75
See application file for complete search history.

(56) References Cited

U.S. PATENT DOCUMENTS

| 4,565,601 A * | 1/1986 | Kakehi et al. | 216/59 |
| 5,825,607 A * | 10/1998 | Burkhart | 361/234 |
| 5,923,521 A * | 7/1999 | Burkhart | 361/234 |
| 6,809,802 B1* | 10/2004 | Tsukamoto et al. | 355/72 |
| 2004/0036850 A1* | 2/2004 | Tsukamoto et al. | 355/72 |
| 2005/0157288 A1* | 7/2005 | Van Peski et al. | 355/75 |

FOREIGN PATENT DOCUMENTS

| EP | 0 947 884 A2 | 10/1999 |
| EP | 0 947 884 A3 | 7/2001 |
| EP | 1 241 706 A2 | 9/2002 |
| EP | 1 241 706 A3 | 2/2004 |

* cited by examiner

Primary Examiner—W. B. Perkey
Assistant Examiner—Vivian Nelson
(74) Attorney, Agent, or Firm—Pillsbury Winthrop Shaw Pittman LLP

(57) ABSTRACT

A lithographic apparatus having an illumination system for providing a projection beam of radiation; an article support member for supporting an article to be placed in a beam path of the projection beam of radiation on the article support; and a clamp for providing a clamping pressure for clamping the article against the article support during projection. The article support member includes a section that is trimmed for locally adjusting a clamping pressure.

17 Claims, 4 Drawing Sheets

LITHOGRAPHIC APPARATUS, ARTICLE SUPPORT MEMBER, AND METHOD

BACKGROUND OF THE INVENTION

1. Field of the Invention

The present invention relates to a lithographic apparatus, an article support member, and a method for manufacturing a device. More specifically, one embodiment of the invention relates to a lithographic apparatus having an illumination system for providing a projection beam of radiation; an article support member for supporting an article to be placed in a beam path of the projection beam of radiation on the article support; and a clamp for providing a clamping pressure for clamping the article against the article support during projection.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device or patterning structure, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at one time, and so-called scanners, in which each target portion is irradiated by scanning the pattern through the projection beam in a given direction (the "scanning"-direction) while synchronously scanning the substrate parallel or anti-parallel to this direction.

Designing article supports such as wafer tables or reticle supports in a lithographic system is a necessary process. Conventionally, the article support is provided with protrusions that are arranged to improve the flatness of the substrate. European patent application EP0947884 describes a lithographic apparatus having a substrate holder wherein protrusions are arranged to improve the flatness of the substrate in a vacuum clamped wafer support table. These protrusions have a general diameter of 0.5 mm and are located generally at a distance of 3 mm away from each other and thereby form a bed of supporting members that support the substrate. For an electrostatic clamp, typically, the height of the protrusions lies in the range 1 μm–15 μm. For a vacuum clamp, these protrusions generally have a height of 100 μm. Due to the relative large spaces in between the protrusions, contaminations possibly present generally do not form an obstruction for the flatness of the substrate, since these will be lying in between the protrusions and will not lift the substrate locally.

In the context of this application, the said "article" may be any of the above mentioned terms wafer, reticle, mask, or substrate, more specifically terms such as a substrate to be processed in manufacturing devices employing lithographic projection techniques; or a lithographic projection mask or mask blank in a lithographic projection apparatus, a mask handling apparatus such as mask inspection or cleaning apparatus, or a mask manufacturing apparatus or any other article or optical element that is clamped in the light path of the radiation system.

From the above identified patent application it is known that the design of these protrusions requires careful choice of design parameters that are influential to the pressure applied to the wafer, and thus its vertical position and flatness. Other publications such as EP1241706 are related to an electrostatic wafer support table, wherein a substrate is electrostatically clamped to the wafer support table. Known electrostatic clamps are usually provided with an arrangement arranged to use a backfill gas, which is used to fill the spaces formed between the protrusions, a base plate that forms a ground layer for supporting the protrusions and the backside of a substrate clamped by the substrate holder. Such a backfill gas enhances the heat transfer capability from the substrate to the substrate holder. In order not to spill this backfill a wall may be present having a contour that generally follows the contour of the substrate and which provides, when the substrate contacts the substrate holder, a confining environment is provided that restricts gas-outflow. It was found that, also for electrostatic clamping configurations, especially for electrostatic clamping configurations where a hard rim is present for confining a backfill gas to the back of a substrate to be irradiated, the wafer tends to be supported unevenly, especially near the boundary of the protrusion configuration, due to the termination of support near the boundary edge. This may cause, depending on the degree of overhang, an upward lifting of the wafer or a downward "sagging" near the edges, which may result in unacceptable imaging quality. Hence, here, also the design parameters can change substantially the amount of levelness of an article to be supported by the article support.

However, design choices are limited by manufacturing tolerances. It has been found that manufacturing tolerances can be a problem to meet the specifications of particular article support designs, in particular relating to vacuum seal position, burl position and stiffness, and di-electricum thicknesses.

SUMMARY OF THE INVENTION

It is desirable to reduce the above mentioned problems and to provide an article support wherein these design specifications are met in a convenient manner. It is further desirable to provide a method for providing such an article support.

According to an aspect of the invention there is provided a lithographic apparatus according to the features of the claims. By providing a lithographic apparatus according to the invention, design features are trimmed so that they can correct design errors, as well as manufacturing errors, or increase the sensitivity with which a design feature is placed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" or "patterning structure" used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

A patterning device or patterning structure may be transmissive or reflective. Examples of a patterning device or patterning structure include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of a patterning device or patterning structure, the support structure may be a frame or table, for example, which may be fixed or movable as needed and which may ensure that the patterning device or patterning structure is at a desired position, for example with respect to the projection system. Any use of the terms "reticle" or "mask" herein may be considered synonymous with the more general term "patterning device" or "patterning structure."

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
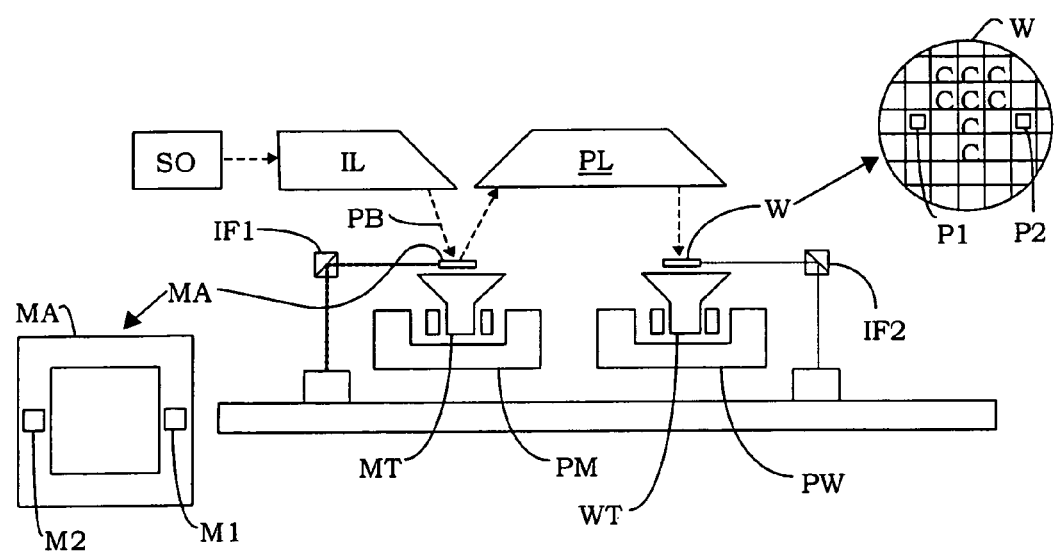
FIG. 1 depicts a lithographic apparatus according to an embodiment of the invention.

FIG. 1 schematically depicts a lithographic apparatus according to a particular embodiment of the invention. The apparatus comprises an illumination system (illuminator) IL for providing a projection beam PB of radiation (e.g. UV or EUV radiation); a first support structure (e.g. a mask table) MT configured to support a patterning device (e.g. a mask) MA and connected to a first positioner PM configured to accurately position the patterning device with respect to item PL; a substrate table (e.g. a wafer table) WT configured to hold a substrate (e.g. a resist-coated wafer) W and connected to a second positioner PW configured to accurately position the substrate with respect to item PL; and a projection system (e.g. a reflective projection lens) PL arranged to image a pattern imparted to the projection beam PB by a patterning device MA onto a target portion C (e.g. comprising one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector comprising for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may comprise an adjuster arranged to adjust the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on a patterning device, illustrated in the form of the mask MA, which is held on the mask table MT. Being reflected by the mask MA, the projection beam PB passes through the lens PL, which focuses the beam onto a target portion C of the substrate W.

With the aid of the second positioner PW and position sensor IF2 (e.g. an interferometric device), the substrate table WT can be moved accurately, e.g. so as to position different target portions C in the path of the beam PB. Similarly, the first positioner PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioners PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as needed after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
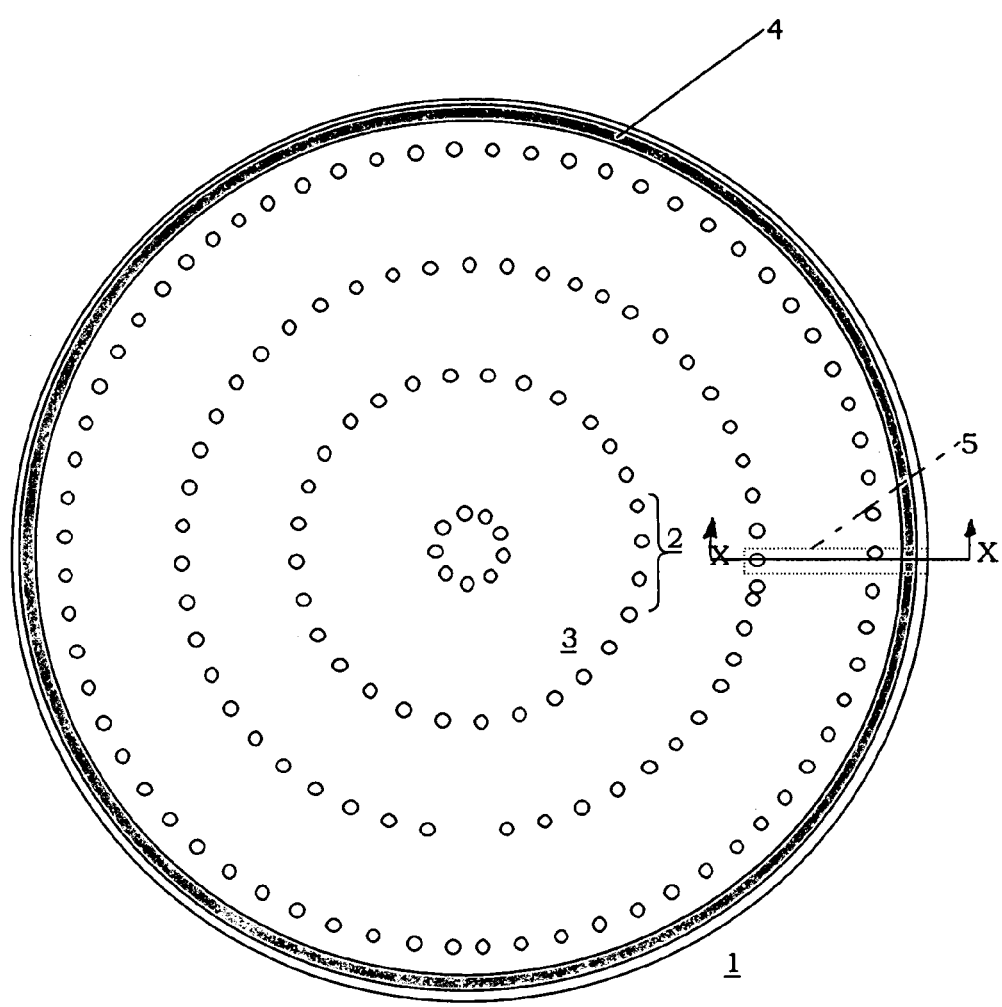
FIG. 2 depicts an embodiment of the article support according to the invention.

FIG. 2 depicts an article support 1. In this embodiment, the article support 1 is for supporting a wafer, shortly to be called wafer support table or wafer table, and generally circular in form, which is common for wafer support tables. However, the article support may also be of another shape, in particular, a square shape. The wafer support table 1 comprises a plurality of protrusions 2 that are dimensioned to provide a flat support for supporting a wafer (not shown in FIG. 2). For clarity's sake, only a few protrusions 2 are referenced. The protrusions 2 thereby define a support zone 3. The boundary of said support zone 3 is formed by a surrounding wall 4, which may form a seal for confining or restricting outflow of backfill gas (not shown). The division line X—X illustrates a sectional view of the remainder, wherein the invention is demonstrated, with reference to FIG. 3. In the box denoted by dotted lines a trimmed section 5 is illustrated, as is further illustrated in side view by FIG. 3 and in top view by FIG. 4.

Figure 3:
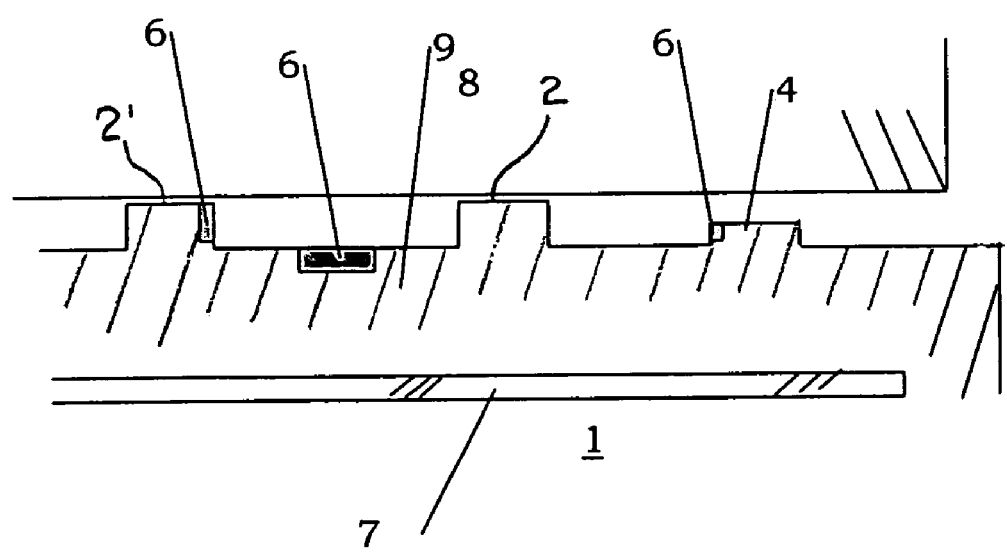
FIG. 3 schematically shows a side view of the line X—X in FIG. 2.
Figure 4:
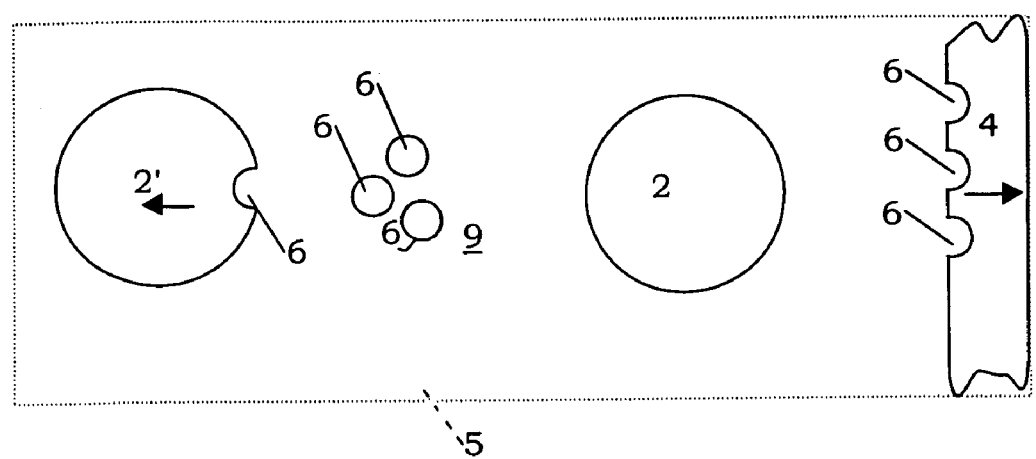
FIG. 4 schematically shows a top view of the trimmed section from FIG. 3.

In FIG. 3, a side view is illustrated of the line X—X in FIG. 2. In FIG. 3 trimmings 6 are illustrated for locally adjusting a clamping pressure. A trimming 6 is illustrated in a protrusion 2. A top view of such a protrusion is illustrated in FIG. 4, showing trimming 6. Further in FIG. 3 an electrostatic clamp 7 is shown, although it is clear that the invention is also applicable for vacuum clamps, where a substrate 8 (wafer or reticle) is clamped by vacuum pressure and electrostatic clamp may therefore be absent. The electrostatic clamp 7 is covered by a dielectric layer 9 which may be integral to the wafer support structure comprising the protrusions 2. In the dielectric layer 9 a further trimming 6 is applied by cutting out a top section of the layer 9.

Turning to the trimmed protrusion or burl 2', it's stiffness partly depends on burl radius. The burl contact surface is a load concentration, with a stiffness loss proportional to the contact radius:

$$k = 0.5 D^* E = 35 e 6 N/m$$

Here, D is the diameter of the burl and E is the elastic modulus. Trimming the burl diameter by 10% introduces a 10% more flexible connection (3 nm per 1 N burl load). With a 0.5 N burl load, the wafer can be dropped 1.5 nm per 10% reduction of burl diameter. It is shown that by trimming locally (a plurality of) burls, local distortions, in particular, undesired rising of a wafer 8 can be mitigated. It will be clear that such a trimming can both be applied to correct manufacture defects, wherein (a plurality) of supporting protrusions do not meet the needed level of flatness, as to correct design defects, where it appears that a particular configuration of protrusions introduces a load that is uneven over an area of the wafer. Such unevenness may arise from intrinsic aspects of a certain chosen burl geometry, or from boundary effects of edges etc. near a boundary of burls.

Now, turning to the dielectric layer 9, by locally trimming the thickness thereof the capacitive properties of the electrostatic clamp 7 are influenced. The pressure applied by the electrostatic clamp 7 to the wafer surface 8 depends on the distance between the electrode 7 and the surface 8 of the wafer, and the effective permittivity of the space between them. Trimming the surface of a di-electricum between the electrode and the wafer would lower the total effective permittivity, and thus lower the pressure applied to the wafer by the clamp, thus raising the wafer above the trimmed area. Hence, partially trimming at pitches would increase the sensitivity of the method, causing a waviness of the wafer keeping the pitches small would keep the waviness below 1 nm, or any other desired level, depending on the wafer thickness.

Finally, turning to the surrounding wall 4, the flatness of a wafer above a vacuum seal depends on the distance between the vacuum seal and the burls. Hence, the location greatly influences the design of the vacuum seal. Applying a trimming 6 as illustrated in FIGS. 3 and 4 can be used to achieve accuracies that cannot be reached with normal manufacturing methods, or it can be used to correct design errors. By applying said trimming, the pressure drop across the vacuum seal is linear. Computing the moment that is applied to the wafer about the outer, edge of burls, as a rule of thumb, the effective end of the pressure is above the seal, at ⅓ of the seal width from the inner (high pressure) seal edge. Hence, by moving the whole seal the point of effective pressure effectively moves end over the same distance.

Moving the outer edge only moves the effective end of pressure over ⅓ of the length of the part of the outer edge that is removed. Moving the inner edge only moves the effective end of pressure over ⅔ of the part of the length of the part of the inner edge that is removed.

Thus, design errors can be corrected by trimming, and placing the effective end of the pressure is more precise by trimming one edge, instead of moving the entire edge. It is illustrated that by trimming a seal or a protrusion, effectively, an effective centre of force can be moved over the surface of the article support, influencing the flatness properties of the wafer. Although the entire edge of the vacuum seal 4 can be trimmed, so as to extend along an entire edge of the seal 4, it can also be partly trimmed, by removing at a certain spacing only parts of the edge. This principle is illustrated in FIG. 4. By such local trimming the sensitivity of the method may even be increased. When at a spacing of for example 10 mm, 1 mm wide parts are removed of the seal, the sensitivity of the method will increase by a factor 10.

While specific embodiments of the invention have been described above, it will be appreciated that the invention may be practiced otherwise than as described. Although FIG. 2 shows a single trimmed section, and FIG. 3 and FIG. 4 show trimmings applied to both a supporting protrusion 2', dielectric surface 9 and a surrounding wall 4, if desired, trimmings may be applied selectively to any of these items without departing from the scope of the claims. The description is not intended to limit the invention.

The invention claimed is:

1. A lithographic apparatus comprising:
   an illumination system arranged to provide a radiation beam;
   an article support member configured to support an article to be placed in a beam path of said radiation beam on said article support member; and
   a clamp configured to provide a clamping pressure to clamp said article against said article support member, wherein said article support member comprises a trimmed section configured to locally adjust said clamping pressure.

2. A lithographic apparatus according to claim 1, wherein said trimmed section comprises at least one protrusion constructed to support said article or to provide a boundary of a pressure zone between said article and said article support member.

3. A lithographic apparatus according to claim 2, wherein said protrusion comprises a cut out region that expands to an upper surface of said protrusion.

4. A lithographic apparatus according to claim 1, wherein said trimmed section comprises a carved section obtained by cutting, milling or drilling.

5. A lithographic apparatus according to claim 1, wherein said clamp comprises an electrostatic clamp comprising an electrode and a dielectric layer covering said electrode, wherein said dielectric layer is trimmed so as to vary a local thickness of said layer.

6. A lithographic apparatus according to claim 1, wherein said article support member is a support configured to support a patterning device, said patterning device serving to impart said beam with a pattern in its cross-section.

7. A lithographic apparatus according claim 1, wherein said article support member is a substrate table configured to support a substrate to be patterned by a patterned beam onto a target portion of said substrate.

8. An article support member configured to support an article; said article support member comprising:
   a clamp configured to provide a clamping pressure to clamp the article against said article support member, and
   wherein said article support member comprises a trimmed section configured to locally adjust said clamping pressure.

9. An article support member according to claim 8, wherein said trimmed section comprises a protrusion that has a trimmed side wall, so that said protrusion has a geometric center that is moved with respect to a non-trimmed protrusion.

10. An article support member according to claim 9, wherein an upper surface of said protrusion comprises a cut-out region.

11. An article support member according to claim 8, wherein said trimmed section is a local depression in a side wall of a protrusion.

12. An article support member according to claim 8, wherein said trimmed section is a section that extends along a side of a top surface of a protrusion.

13. An article support member according to claim 8, wherein said trimmed section comprises a carved section obtained by cutting, milling or drilling.

14. An article support member according to claim 8, wherein said article support member is a support configured to support a patterning device, which serves to impart a beam with a pattern in its cross-section.

15. An article support member according to claim 8, wherein said article support member is a substrate table configured to support a substrate to be patterned by a patterned beam onto a target portion of the substrate.

16. A method of manufacturing an article support member configured to support an article to be placed in a beam path of a projection beam of radiation on the article support member in a lithographic apparatus comprising:
   providing the article support member including a clamp configured to provide a clamping pressure for clamping the article against the article support member;
   evaluating a flatness of the article support member; and
   trimming at least one section of the article support member so as to locally adjust a clamping pressure of the clamp.

17. A method according to claim 16, wherein the trimming is performed iteratively.

* * * * *